US012738587B2

(12) United States Patent
Moon et al.

(10) Patent No.: US 12,738,587 B2
(45) **Date of Patent: *Sep. 15, 2026**

(54) BATTERY PACK

(71) Applicant: SAMSUNG SDI CO., LTD., Yongin-si (KR)

(72) Inventors: Soodeok Moon, Yongin-si (KR); Byunghyun Lee, Yongin-si (KR); Younghwan Kwon, Yongin-si (KR); Jaepil Ahn, Yongin-si (KR); Jaehoon Kim, Yongin-si (KR); Jihyeon Lee, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 164 days.

This patent is subject to a terminal disclaimer.

(21) Appl. No.: 18/596,988

(22) Filed: Mar. 6, 2024

(65) Prior Publication Data

US 2024/0258630 A1 Aug. 1, 2024

Related U.S. Application Data

(63) Continuation of application No. 17/473,073, filed on Sep. 13, 2021, now Pat. No. 12,113,232.

(30) Foreign Application Priority Data

Oct. 13, 2020 (KR) ........................ 10-2020-0131814

(51) Int. Cl.
*H01M 50/284* (2021.01)
*H01B 7/08* (2006.01)
(Continued)

(52) U.S. Cl.
CPC ....... *H01M 50/284* (2021.01); *H01M 10/425* (2013.01); *H01M 50/209* (2021.01);
(Continued)

(58) Field of Classification Search
CPC .... H05K 1/0296; H05K 1/028; H01M 10/425
See application file for complete search history.

(56) References Cited

U.S. PATENT DOCUMENTS 10,084,211 B2 9/2018 Nomoto et al.
10,644,292 B2 5/2020 Takase et al.
(Continued)

FOREIGN PATENT DOCUMENTS

CN 104067412 A 9/2014
CN 107851754 A 3/2018
(Continued)

OTHER PUBLICATIONS

Office Action dated Dec. 29, 2023, of the corresponding CN Patent Application No. 202111186753.2.
(Continued)

*Primary Examiner* — Jonathan G Leong
*Assistant Examiner* — Drew C Newman
(74) *Attorney, Agent, or Firm* — Lee IP Law, P.C.

(57) ABSTRACT

A battery pack including battery cells; a circuit unit connected to the battery cells; and a flexible wiring connecting the battery cells and the circuit unit to each other, wherein the flexible wiring includes a first end portion to which a plurality of conductive lines are physically bound; and a first group of conductive lines and a second group of conductive lines which extend from the first end portion, branch off from each other, and then extend in parallel to each other, and the first group of conductive lines includes a folded portion at a branching position at which the first group of conductive lines is separated from the second group of conductive lines.

9 Claims, 9 Drawing Sheets

(51) Int. Cl.

| | |
|---|---|
| ***H01B 9/00*** | (2006.01) |
| ***H01M 10/42*** | (2006.01) |
| ***H01M 50/209*** | (2021.01) |
| ***H01M 50/298*** | (2021.01) |
| ***H01M 50/502*** | (2021.01) |
| ***H05K 1/02*** | (2006.01) |

(52) U.S. Cl.
CPC ....... *H01M 50/298* (2021.01); *H01M 50/502* (2021.01); *H05K 1/028* (2013.01); *H01B 7/0823* (2013.01); *H01B 9/006* (2013.01); *H05K 2201/10037* (2013.01)

(56) References Cited

U.S. PATENT DOCUMENTS

| | | | |
|---|---|---|---|
| 10,804,622 | B2 | 10/2020 | Washio et al. |
| 10,903,469 | B2 | 1/2021 | Ju et al. |
| 11,063,322 | B2 | 7/2021 | Ota et al. |
| 2012/0328920 | A1 | 12/2012 | Takase et al. |
| 2014/0370343 | A1 | 12/2014 | Nomoto et al. |
| 2017/0271642 | A1 | 9/2017 | Groshert et al. |
| 2018/0219204 | A1 | 8/2018 | Takase et al. |
| 2019/0181418 | A1 | 6/2019 | Son et al. |
| 2020/0020912 | A1 | 1/2020 | Ota et al. |
| 2020/0020919 | A1 | 1/2020 | Makino |
| 2020/0344885 | A1 | 10/2020 | Lee et al. |
| 2021/0226260 | A1 | 7/2021 | Moon et al. |

FOREIGN PATENT DOCUMENTS

| | | | |
|---|---|---|---|
| CN | 110718660 | A | 1/2020 |
| JP | 2001-222915 | A | 8/2001 |
| JP | 3694207 | B2 | 7/2005 |
| JP | 6507056 | B2 | 4/2019 |
| JP | 6638584 | B2 | 1/2020 |
| KR | 10-2018-0022445 | A | 6/2018 |
| KR | 10-2019-0130929 | A | 11/2019 |
| KR | 10-2020-0102188 | A | 8/2020 |

OTHER PUBLICATIONS

European Search Report dated Feb. 28, 2022.
Korean Office Action issued Apr. 7, 2023.

BATTERY PACK

CROSS-REFERENCE TO RELATED APPLICATIONS

This is a continuation application based on application Ser. No. 17/473,073, filed Sep. 13, 2021, now U.S. Pat. No. 12,113,232, the entire contents of which is hereby incorporated by reference.

This application is based on and claims priority under 35 U.S.C. § 119 to Korean Patent Application No. 10-2020-0131814, filed on Oct. 13, 2020, in the Korean Intellectual Property Office, the disclosure of which is incorporated by reference herein in its entirety.

BACKGROUND

1. Field

Embodiments relate to a battery pack.

2. Description of the Related Art

Secondary batteries refer to batteries that may be repeatedly charged and recharged unlike non-rechargeable primary batteries. Secondary batteries may be used as energy sources of devices such as mobile devices, electric vehicles, hybrid vehicles, electric bicycles, or uninterruptible power supplies. Secondary batteries may be individually used or secondary battery modules (packs) each including a plurality of secondary batteries connected as one unit are used according to the types of external devices using secondary batteries.

SUMMARY

The embodiments may be realized by providing a battery pack including battery cells; a circuit unit connected to the battery cells; and a flexible wiring connecting the battery cells and the circuit unit to each other, wherein the flexible wiring includes a first end portion to which a plurality of conductive lines are physically bound; and a first group of conductive lines and a second group of conductive lines which extend from the first end portion, branch off from each other, and then extend in parallel to each other, and the first group of conductive lines includes a folded portion at a branching position at which the first group of conductive lines is separated from the second group of conductive lines.

The first group of conductive lines and the second group of conductive lines may extend from the first end portion in a first direction, may be spaced apart from each other in a second direction crossing the first direction at the branching position, and may be connected to first and second electrodes at opposite sides of the battery cells in the second direction.

The first group of conductive lines may include connection positions connected to different ones of the battery cells along a first direction.

The connection positions may be on a rear side of the folded portion, the rear side being opposite the first end portion in the first direction such that the folded portion is between the connection positions and the first end portion.

At least two conductive lines of the first group of conductive lines may be connected together at each of the connection positions.

The battery pack may further include a connection member, wherein the at least two conductive lines connected together at each of the connection positions are connected together to the connection member.

The at least two conductive lines connected together at each of the connection positions may include a first conductive line, and the first conductive line may include a cut position at which the first conductive line is cut.

The cut position may be on the first conductive line in front of the connection position in the first direction such that the cut position is between the connection position and the first end portion.

The first conductive line may be a dummy line that does not transmit battery-cell state information obtained at the connection position to the first end portion.

The at least two conductive lines connected together at each of the connection positions may further include a second conductive line different from the first conductive line, and the first conductive line may be connected to the second conductive line through a bridge line between the cut position and the connection position.

The cut position of the first conductive line may be behind the connection position in the first direction such that the connection position is between the cut position and the first end portion.

The at least two conductive lines connected together at each of the connection positions may further include a second conductive line different from the first conductive line, and the first conductive line and the second conductive line may include parallel conductive lines which together transmit battery-cell state information obtained at the connection position to the first end portion.

At least two conductive lines of the first group of conductive lines may be electrically connected to each other through a bridge line, and the at least two conductive lines electrically connected through the bridge line may include parallel conductive lines which together transmit battery-cell state information obtained at a connection position of the connection positions to the first end portion.

The at least two conductive lines electrically connected to each other through the bridge line may include a first conductive line, and a cut position at which the first conductive line is cut may be on the first conductive line in front of the connection position such that the cut position is between the connection position and the first end portion.

The at least two conductive lines electrically connected to each other through the bridge line may include a first conductive line and a second conductive line different from each other, and the first conductive line and the second conductive line may be connected together at the connection position.

Conductive lines of the first group of conductive lines may be connected to different battery cells at different connection positions.

The first group of conductive lines may include a cut position at which at least one conductive line is cut, the cut position being between the different connection positions in the first direction.

The battery pack may further include connection members at the connection positions, wherein the connection members extend in a second direction crossing the first direction and are connected to the first group of conductive lines.

At least one conductive line of the first group of conductive lines may be directly connected, through a direction-change portion at one of the connection positions, to one of the battery cells or to a bus bar connected to the one of the battery cells.

The first group of conductive lines may include a cut position at which the at least one conductive line is cut, the cut position being behind the direction-change portion in the first direction such that the direction-change portion is between the cut position and the first end portion.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
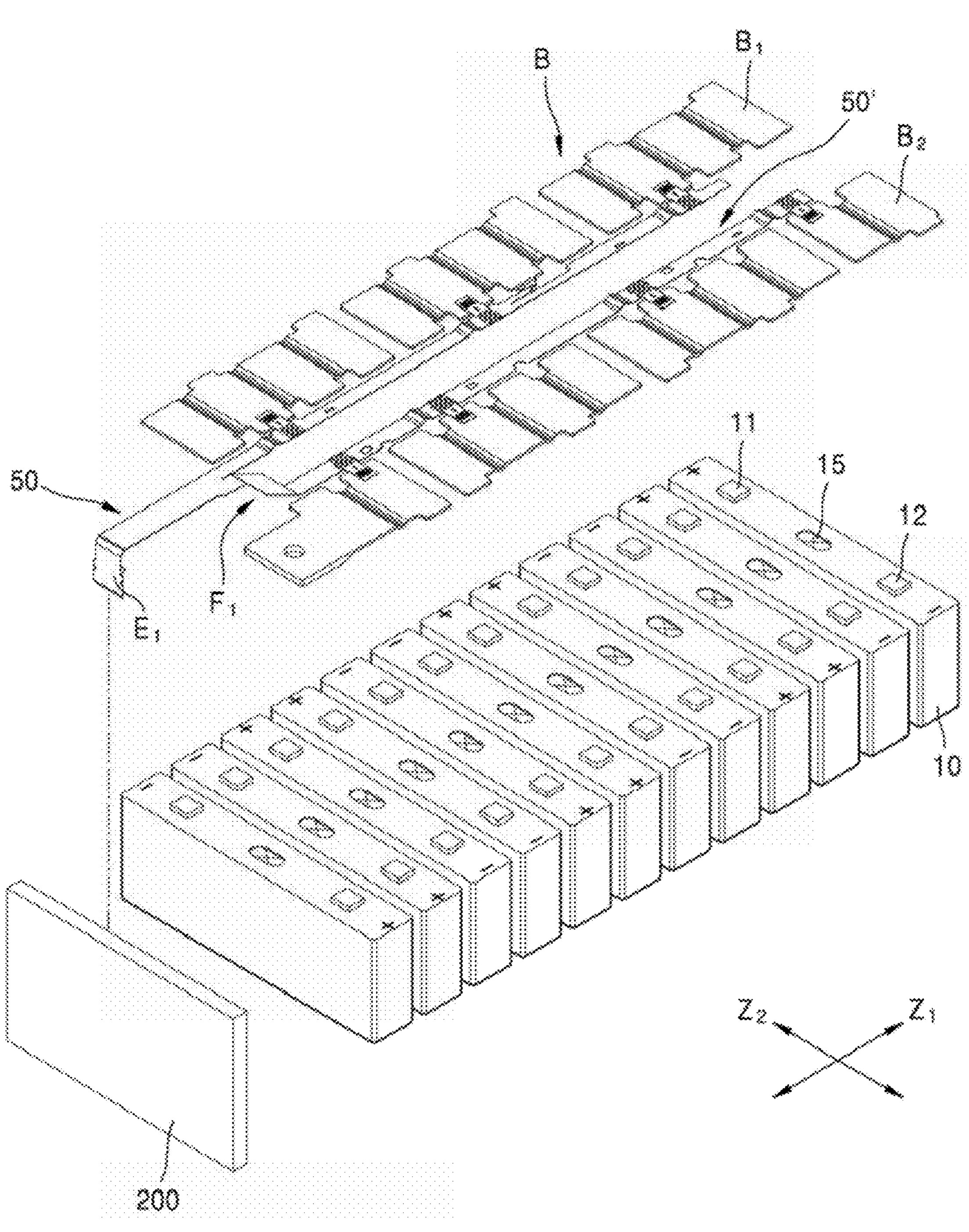
FIG. 1 is an exploded perspective view of a battery pack according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, the terms "or" and "and/or" include any and all combinations of one or more of the associated listed items, e.g., "A or B" would include A, B, or A and B. Expressions such as "at least one of," when preceding a list of elements, modify the entire list of elements and do not modify the individual elements of the list.

Hereinafter, a battery pack will be described according to embodiments with reference to the accompanying drawings.

Figure 2:
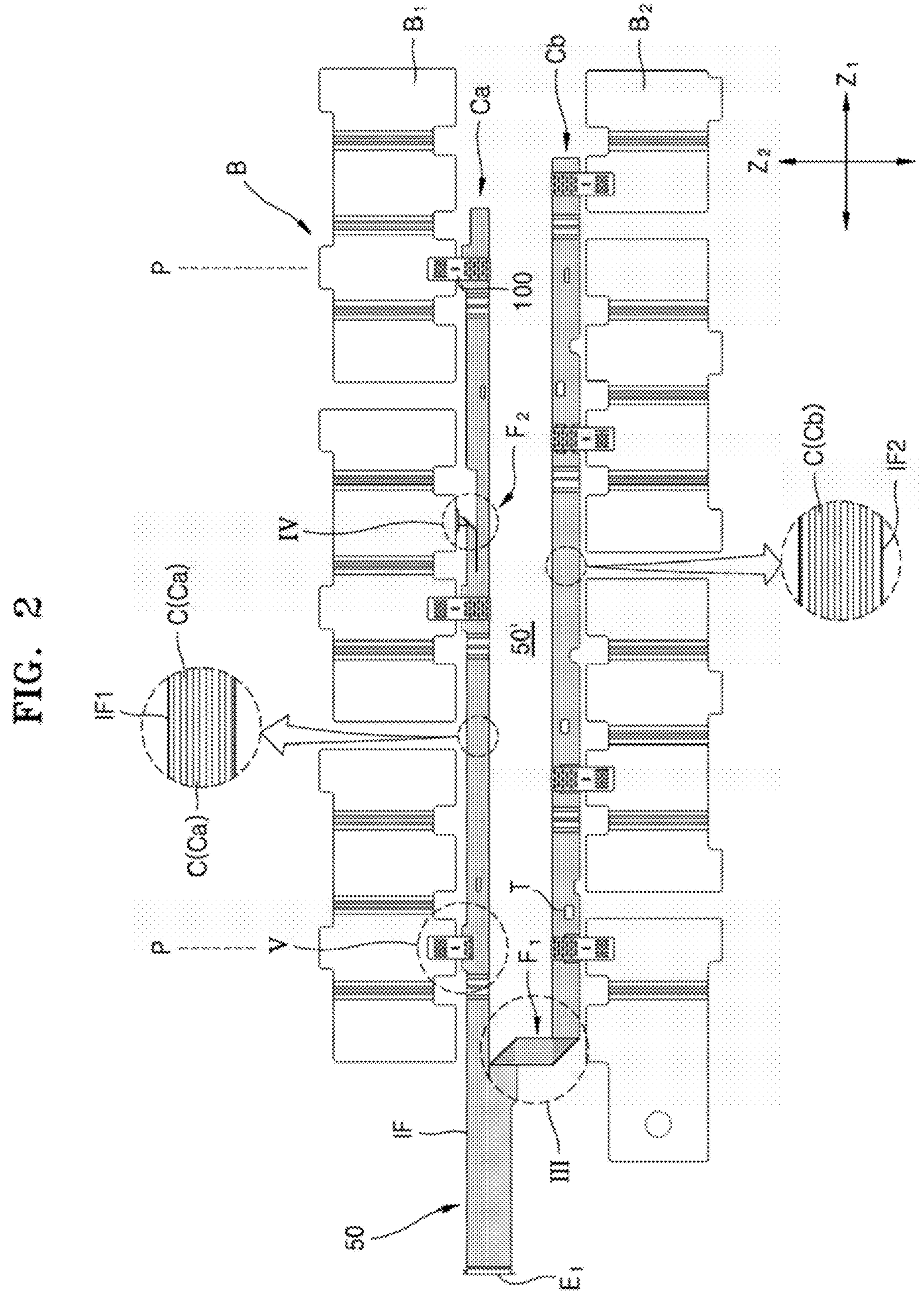
FIG. 2 is a view of a portion of the battery pack shown in FIG. 1.
Figure 3:
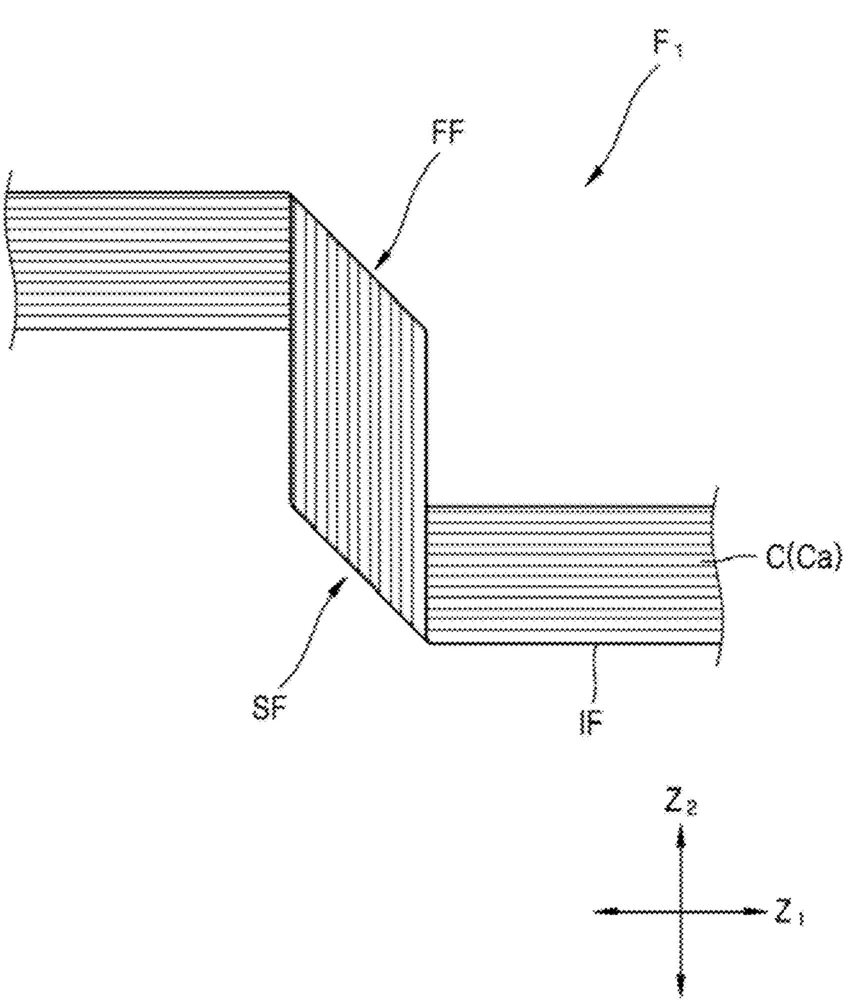
FIGS. 3 to 5 are enlarged views respectively illustrating portions III, IV, and V in FIG. 2.
Figure 4:
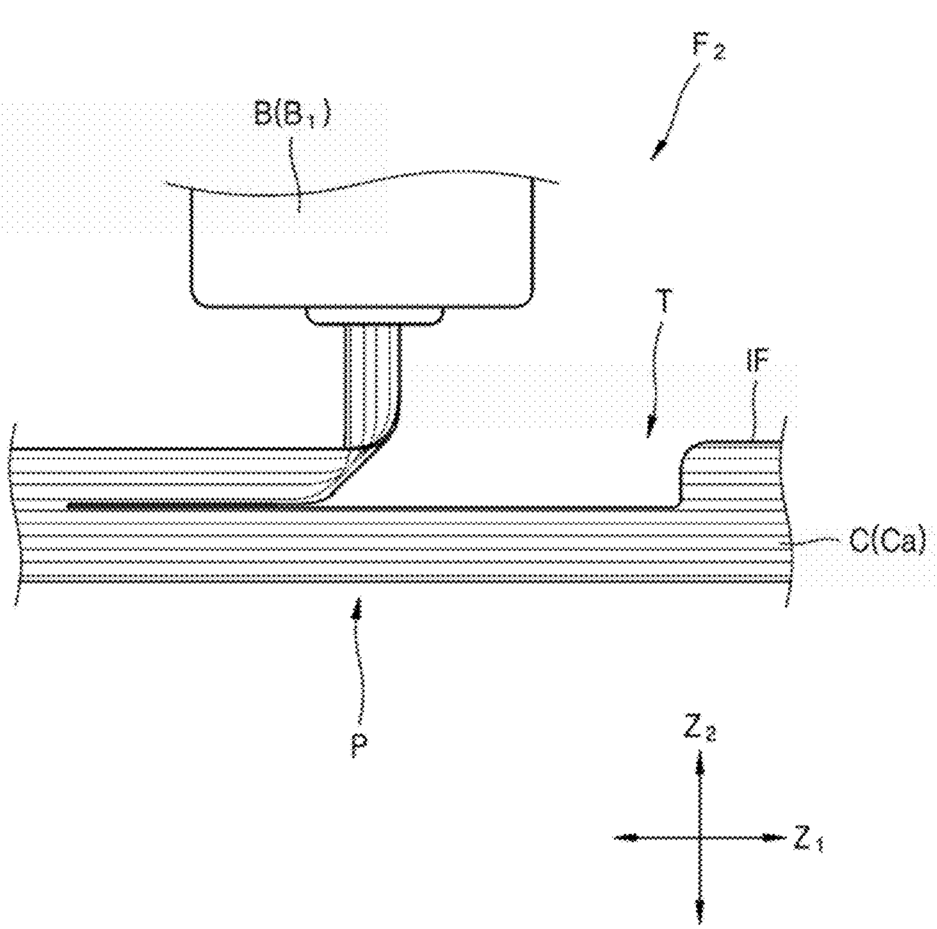
Figure 5:
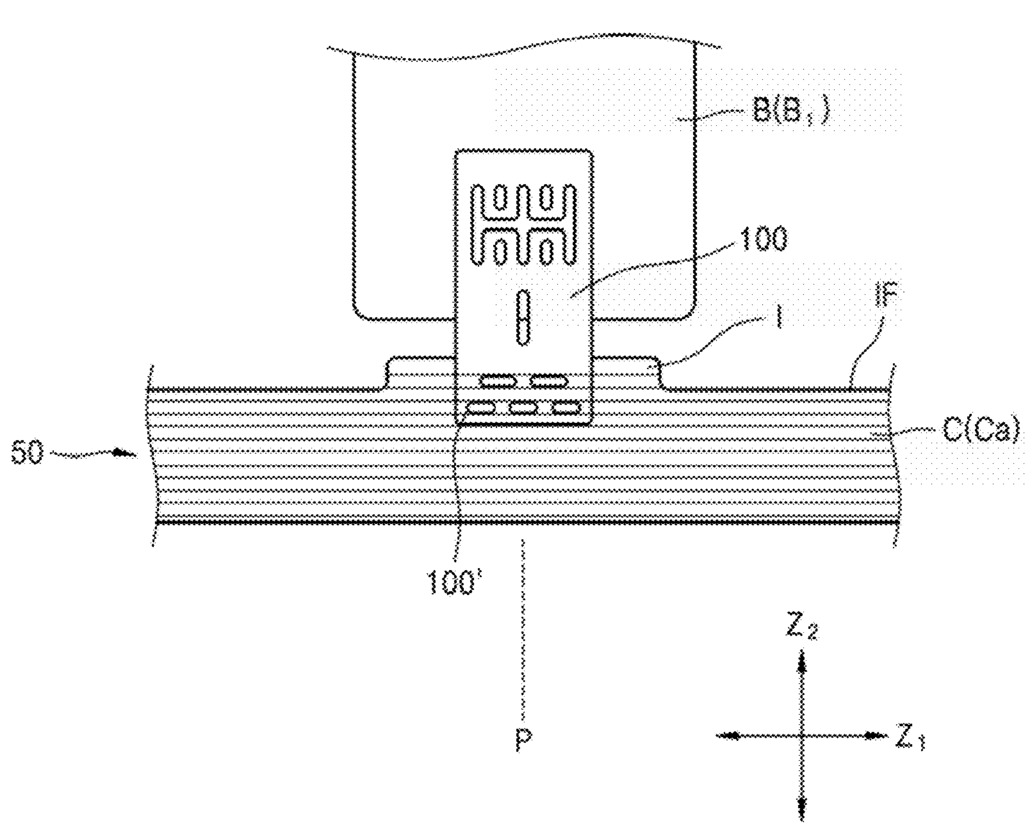
Figure 6:
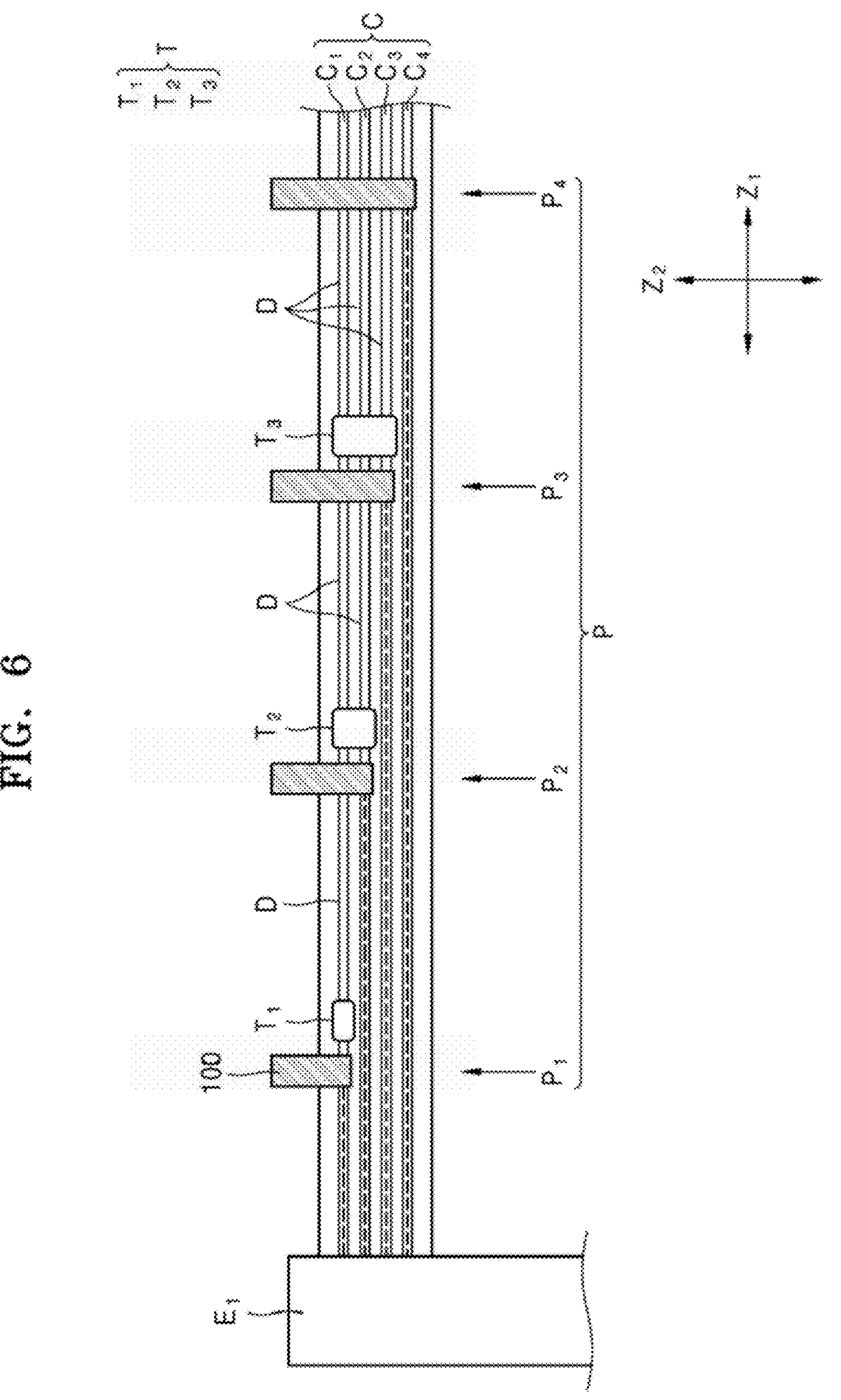
FIG. 6 is a view of dummy lines as structures of flexible wiring according to an embodiment.
Figure 7:
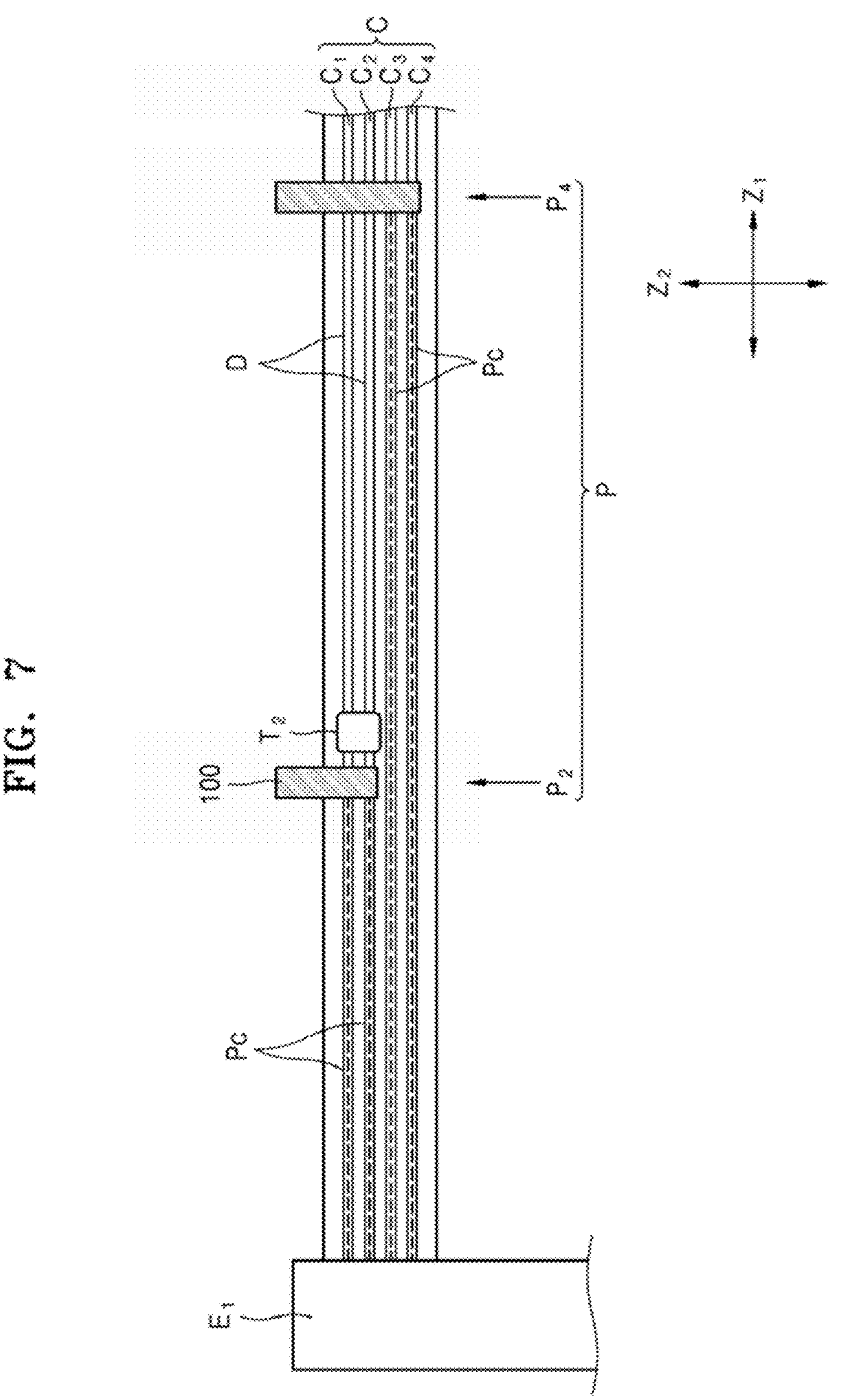
FIGS. 7 and 8 are views of parallel conductive lines as structures of the flexible wiring according to embodiments.
Figure 8:
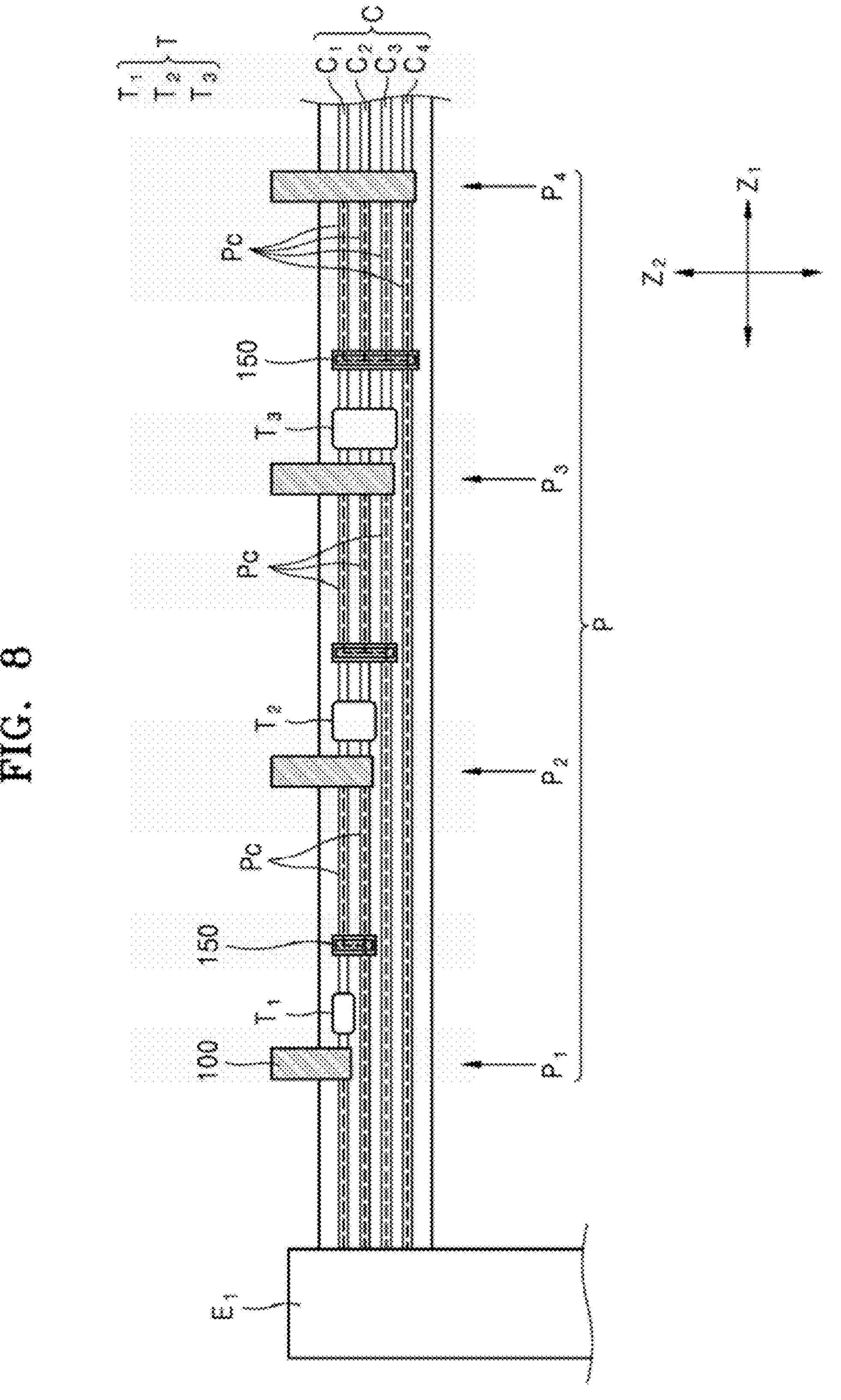
Figure 9:
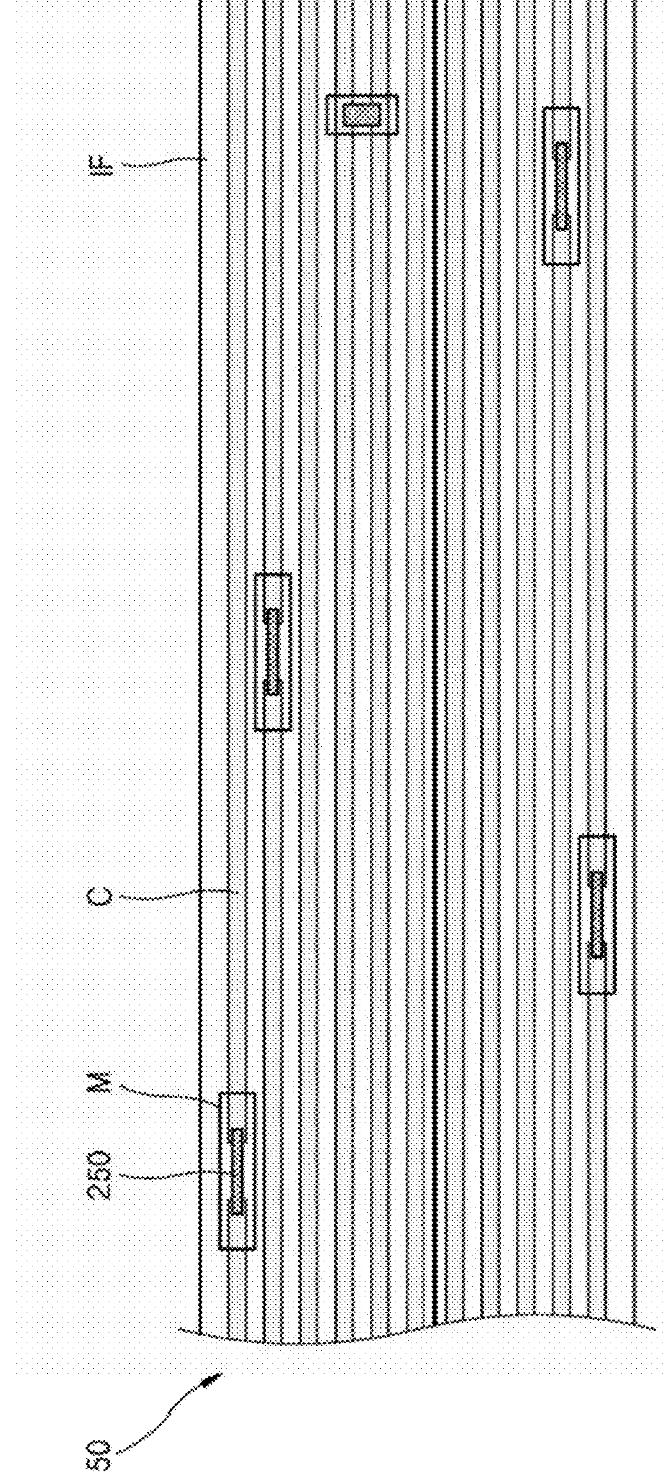
FIG. 9 is a view showing how circuit elements are mounted as structures of the flexible wiring according to an embodiment.

FIG. 1 is an exploded perspective view of a battery pack according to an embodiment. FIG. 2 is a view of a portion of the battery pack shown in FIG. 1. FIGS. 3 to 5 are enlarged views respectively illustrating portions III, IV, and V in FIG. 2. FIG. 6 is a view of dummy lines D as structures of flexible wiring 50 according to an embodiment. FIGS. 7 and 8 are views of parallel conductive lines PC as structures of the flexible wiring 50 according to embodiments. FIG. 9 is a view showing how circuit elements 250 are mounted as structures of the flexible wiring 50 according to an embodiment.

Referring to FIGS. 1 and 2, according to an embodiment, the battery pack may include, e.g., battery cells 10; a circuit controller or circuit unit 200 on the battery cells 10; and a flexible wiring 50 connecting (e.g., electrically connecting) the battery cells 10 and the circuit unit 200 to each other. In an implementation, the flexible wiring 50 may include, e.g., a first end or first end portion $E_1$ (to which a plurality of conductive lines C are physically bound); a first group Ca of conductive lines and a second group Cb of conductive lines (extending from the first end portion $E_1$, branching off from each other, and then extending in parallel to each other); and a folded region or folded portion $F_1$ on or in at least one of the first group Ca of conductive lines and the second group Cb of conductive lines to form a separation space 50' (by which one group of conductive lines is separated from the other group of conductive lines).

The flexible wiring 50 may include the plurality of conductive lines C and an insulating film IF in which the plurality of conductive lines C are embedded together. The plurality of conductive lines C may be insulated from the external environment and from each other, e.g., by being embedded in the insulating film IF. The flexible wiring 50 may extend (e.g., lengthwise) in a first direction $Z_1$ and may include a plurality of conductive lines C arranged (e.g., spaced apart) in a second direction $Z_2$ crossing the first direction $Z_1$ (e.g., in which the flexible wiring 50 extends). Among the plurality of conductive lines C arranged in the second direction $Z_2$, conductive lines C arranged at the same position in the second direction $Z_2$ may be considered as the same conductive line C. As described below, on a conductive line C extending in the first direction $Z_1$, a cut position T (e.g., at which the conductive line C is cut) may be formed. In an implementation, the conductive line C may be divided at the cut position into a conductive line C in front (e.g., at one side) of the cut position T and a conductive line C behind (e.g., at another side of) the cut position T, which have different functions, and the conductive line C in front of the cut position T and the conductive line C behind the cut position T may be functionally distinguished from each other.

Throughout the present specification, the first direction $Z_1$ may refer to a direction in which the flexible wiring 50 extends (e.g., lengthwise) or a direction in which a plurality of battery cells 10 are arranged. In this case, "forward" in the first direction $Z_1$ may refer to a direction toward the first end portion $E_1$, and "backward" in the first direction $Z_1$ may refer to a direction opposite the first end portion $E_1$. In addition, throughout the present specification, the second direction $Z_2$ is a direction crossing the first direction $Z_1$ and may refer to a direction in which first and second electrodes 11 and 12 of the battery cells 10 are away or spaced apart from each other, or a direction in which first and second bus bars $B_1$ and $B_2$ (connected to the first and second electrodes 11 and 12 of the battery cells 10) are away or spaced apart from each other. In an implementation, the second direction $Z_2$ may perpendicularly cross the first direction $Z_1$.

In an implementation, the flexible wiring 50 may transmit information on the voltages of the battery cells 10, e.g., the flexible wiring 50 may transmit information on the voltages of the battery cells 10 to the circuit unit 200. The conductive lines C may be connected to bus bars B that electrically connect the battery cells 10 to each other, and e.g., the conductive lines C may be respectively connected to different bus bars B. In an implementation, battery cells 10 connected through the same bus bar B may have the same voltage, and voltage information on a plurality of battery cells 10 having the same voltage may be obtained through conductive lines C connected to the same bus bar B.

The flexible wiring 50 may extend in the first direction $Z_1$, e.g., in which the battery cells 10 are arranged. In an implementation, the flexible wiring 50 may include: the first end portion $E_1$ (to which the conductive lines C are physically bound); and the first group Ca of conductive lines and the second group Cb of conductive lines, which extend in the first direction $Z_1$, branch off from each other, and then extend in the first direction $Z_1$ with the separation space 50' therebetween. The first group Ca of conductive lines and the second group Cb of conductive lines may be spaced apart from each other in the second direction $Z_2$ and may be respectively connected to the first and second electrodes 11 and 12 of the battery cells 10, which are spaced apart from each other in the second direction $Z_2$, or respectively connected to the first and second bus bars $B_1$ and $B_2$, which are connected to the first and second electrodes 11 and 12 of the battery cells 10.

In an implementation, each of the battery cells 10 may include a first electrode 11 and a second electrode 12 which are spaced apart from each other in the second direction $Z_2$, and the first and second electrodes 11 and 12 may be connected to the first and second bus bars $B_1$ and $B_2$. In this case, the first and second electrodes 11 and 12 of the battery cells 10 refer to electrodes at positions spaced apart from each other in the second direction $Z_2$, and may have the same polarity or different polarities depending on the orientations of the battery cells 10 arranged in the first direction $Z_1$. The terms "first and second electrodes 11 and 12" are determined depending on the positions of the electrodes of the battery cells 10 regardless of the polarities of the electrodes of the battery cells 10. In an implementation, in the arrangement in which the battery cells 10 are arranged in (e.g., aligned in a row along) the first direction $Z_1$ with left-right reversed orientations in the second direction $Z_2$, the first electrodes 11 of the battery cells 10 arranged adjacent to each other in the first direction $Z_1$ may have different polarities, and similarly, the second electrodes 12 of the battery cells 10 arranged adjacent to each other in the first direction $Z_1$ may have different polarities. Conversely, in the arrangement in which the battery cells 10 are arranged in the first direction $Z_1$ with the same left-right orientation in the second direction $Z_2$, the first electrodes 11 of the battery cells 10 arranged adjacent to each other in the first direction $Z_1$ may have the same polarity, and similarly, the second electrodes 12 of the battery cells 10 arranged adjacent to each other in the first direction $Z_1$ may have the same polarity.

As described above, the first bus bars $B_1$ may be connected to the first electrodes 11 of the battery cells 10 (e.g., in the second direction $Z_2$), and the second bus bars $B_2$ may be connected to the second electrodes 12 of the battery cells 10 (e.g., in the second direction $Z_2$). In an implementation, the first bus bars $B_1$ may be arranged in (e.g., may extend along) the first direction $Z_1$ while connecting the first electrodes 11 of the plurality of battery cells 10 arranged in or aligned along the first direction $Z_1$, and similarly, the second bus bars $B_2$ may be arranged in the first direction $Z_1$ while connecting the second electrodes 12 of the plurality of battery cells 10 arranged in or aligned along the first direction $Z_1$.

The flexible wiring 50 may be connected to the first and second bus bars $B_1$ and $B_2$, which may be apart from each other in the second direction $Z_2$. In an implementation, the first group Ca of conductive lines of the flexible wiring 50 may be connected to the first bus bars $B_1$, and the second group Cb of conductive lines of the flexible wiring 50 may be connected to the second bus bars $B_2$. The first group Ca of conductive lines and the second group Cb of conductive lines, which are physically bound to each other at the first end portion $E_1$ of the flexible wiring 50, may branch off from each other, with the separation space 50' being therebetween, and may be respectively connected to the first and second bus bars $B_1$ and $B_2$. Here, the description of the first and second groups Ca and Cb of conductive lines being physically bound to each other at the first end portion $E_1$ of the flexible wiring 50 may mean that the first and second groups Ca and Cb of conductive lines are physically bound to each other by being embedded together in the insulating film IF which is continuously formed. In an implementation, the first and second groups Ca and Cb of conductive lines may be physically and closely bound to each other at the first end portion $E_1$ of the flexible wiring 50 by the insulating film IF which is continuously formed, and may then branch off from each other at a branching position (corresponding to the folded portion $F_1$) in a state in which the first and second groups Ca and Cb of conductive lines are respectively embedded in separate first and second insulating films $IF_1$ and $IF_2$ with the separation space 50' being therebetween.

The first and second groups Ca and Cb of conductive lines, which may be bound to each other at the first end portion $E_1$ of the flexible wiring 50, may branch off from each other in the second direction $Z_2$ at the folded portion $F_1$ forming a branching position, and may then approach the first and second bus bars $B_1$ and $B_2$. In an implementation, the folded portion $F_1$ forming a branching position may be selectively formed on one of the first and second groups Ca and Cb of conductive lines, or may be formed on each of the first and second groups Ca and Cb of conductive lines.

Referring to FIG. 3, the folded portion $F_1$ may form a branching position such that the first and second groups Ca and Cb of conductive lines may be separated from each other, and at least one of the first and second groups Ca and Cb of conductive lines may be folded by primary folding FF and secondary folding SF and may thus be separated from the other of the first and second groups Ca and Cb of conductive lines with the separation space 50' therebetween.

In an implementation, the folded portion $F_1$ may be on the first group Ca of conductive lines, the folded portion $F_1$ may be on each of the first and second groups Ca and Cb of conductive lines, or may be on only the second group Cb of conductive lines. Hereinafter, the term "conductive lines C" may be used to refer to both or only one of the first group Ca of conductive lines and the second group Cb of conductive lines.

In an implementation, the folded portion $F_1$ may be on the conductive lines C by primary folding FF and secondary folding SF. In the primary folding FF, the conductive lines C may be folded from the first direction $Z_1$ to the second direction $Z_2$, and in the secondary folding SF, following the primary folding FF, the conductive lines C may be folded from the second direction $Z_2$ to the first direction $Z_1$. In an implementation, the first group Ca of conductive lines may extend (e.g., lengthwise) in the second direction $Z_2$ between the first folding FF and the second folding SF such that the first group Ca of conductive lines may be spaced apart from the second group Cb of conductive lines. In an implementation, the size of the separation space 50' between the first and second groups Ca and Cb of the conductive lines may be determined according to the length of the conductive lines C between the primary folding FF and the secondary folding SF. Throughout the present specification, the description of the conductive lines C being folded at the folded portion $F_1$ or by primary folding FF and secondary folding SF encompasses the conductive lines C being folded together with the insulating film IF in which the conductive lines C are embedded.

Referring to FIGS. 1 and 2, the separation space 50' may correspond to positions of vents 15 on the battery cells 10 between the first and second electrodes 11 and 12. In an implementation, owing to the separation space 50', the flexible wiring 50 may not obstruct the discharge of gas ejected from the vents 15 of the battery cells 10 and may not be damaged by high-pressure, high-temperature gas discharged from the vents 15 of the battery cells 10. In an implementation, even when gas is discharged as the vents 15 are fractured, the flexible wiring 50 may be minimally damaged and may guarantee safe operations of the battery pack under the control of the circuit unit 200.

The first and second groups Ca and Cb of conductive lines may be connected to the first and second bus bars $B_1$ and $B_2$, respectively. The first and second groups Ca and Cb of conductive lines may be connected to the first and second bus bars $B_1$ and $B_2$ which are different from each other. In an implementation, the first group Ca of conductive lines may be connected to different first bus bars $B_1$ at different connection positions P in or along the first direction $Z_1$, and the second group Cb of conductive lines may be connected to different second bus bars $B_2$ at different connection positions P in or along the first direction $Z_1$. In an implementation, the connection positions P of the first group Ca of conductive lines, and the connection positions P of the second group Cb of conductive lines may be behind the folded portion $F_1$, which form a branching position in the first direction $Z_1$, and owing to the folded portion $F_1$, the first group Ca of conductive lines and the second group Cb of conductive lines may respectively approach the first bus bars $B_1$ and the second bus bars $B_2$ and may form connection positions P with the first bus bars $B_1$ and the second bus bars $B_2$.

At a connection positions P, bus bars B and conductive lines C may be selectively connected to each other. In an implementation, a plurality of conductive lines C may extend through one connection position P in the first direction $Z_1$, and one or more of the plurality of conductive lines C may be selectively connected to a corresponding bus bar B. Referring to FIG. 5, conductive lines C and a bus bar B may be (e.g., electrically) connected to each other through a connector or connection member 100. In an implementation, the connection member 100, which may extend from the bus bar B in the second direction $Z_2$, may be connected to one or more of a plurality of conductive lines C extending through a connection position P. In an implementation, a conductive line C may be connected to the connection member 100 through a solder or soldering material in coupling holes 100' of the connection member 100. In an implementation, the conductive line C may be exposed from or through the insulating film IF at the connection position P and may be connected to the connection member 100 through the soldering material filled in the coupling holes 100' of the connection member 100. As described above, the conductive line C may be connected to one end of the connection member 100, and the bus bar B may be connected to the other end of the connection member 100, such that the conductive line C and the bus bar B may be (e.g., electrically) connected to each other through the connection member 100. In an implementation, the connection between the end portion of the connection member 100 and the conductive line C may be made by soldering, e.g., the connection between connection members 100 and conductive lines C may be made through a single-batch reflow soldering process. In an implementation, connection members 100 and conductive lines C may be simultaneously connected to each other by reflow soldering at a plurality of connection positions P arranged in the first direction $Z_1$.

Throughout the present specification, the description of conductive lines C and connection members 100 being selectively connected to each other at different connection positions P in the first direction $Z_1$ may mean not only that one conductive line C and one connection member 100 are connected to each other at each connection position P. In an implementation, as shown in FIG. 6, connection members 100 (each extending in the second direction $Z_2$) may each be connected to a plurality of conductive lines C arranged in the second direction $Z_2$ (at each of connection positions $P_2$, $P_3$, and $P_4$). In an implementation, each connection member 100 may be connected to a plurality of conductive lines C, and the connection of each connection member 100 may be physically reinforced. In other types of connection structures, each connection member 100 could form a stable connection with a bus bar B having a relatively large width, but the connection member 100 may not have a sufficient connection area with only one conductive line C having a relatively small width, e.g., possibly resulting in an unstable connection. In an implementation, some connection members 100 may be connected to at least two conductive lines C (e.g., connection members 100 at each of the connection positions $P_2$, $P_3$, and $P_4$) to help ensure a sufficient connection area therebetween. If the same conductive line C (e.g., conductive line $C_1$) were to be connected to different connection members 100 at different connection positions $P_1$, $P_2$, $P_3$, and $P_4$, an electrical short could be formed therebetween. In an implementation, a cut-out or cut position T (e.g., cut position $T_1$) may be between connection positions (e.g., $P_1$ and $P_2$) on a conductive line C (e.g., conductive line $C_1$) connected to different connection members 100 to divide (e.g., to electrically isolate different parts of) the conductive line C. Each cut position T may be on a conductive line C between different connection positions, e.g., connection positions $P_1$, $P_2$, $P_3$, and $P_4$ in the first direction $Z_1$, such that signals providing information on different voltages and obtained at different connection positions $P_1$, $P_2$, $P_3$, and $P_4$ may not be transmitted through the same conductive line C, which could cause an electrical short. In an implementation, cut positions T may have various shapes, e.g., a closed hole shape inside the flexible wiring 50 or a groove shape open to the outside of the flexible wiring 50, depending on the positions of conductive lines C to be cut.

Throughout the present specification, the description of at least two conductive lines C being connected to one connection member 100 (at each of the connection positions $P_2$, $P_3$, and $P_4$) may mean that the at least two conductive lines C and the connection member 100 are physically connected to each other to physically reinforce the connection of the connection member 100. In an implementation, at least two conductive lines C may form physical connections with one connection member 100 (at each of the connection positions $P_2$, $P_3$, and $P_4$), and only some, e.g., only one of the at least two conductive lines C, may form an electrical connection with the connection member 100 to transmit voltage information to a bus bar B, and the other conductive lines C may be dummy lines D that do not form electrical connections with the connection member 100. In an implementation, a plurality of conductive lines C and a connection member 100 may be physically connected to each other (at each of the connection positions $P_2$, $P_3$, and $P_4$). In an implementation, not all the plurality of conductive lines C may be electrically connected to the connection member 100, and some of the plurality of conductive lines C, e.g., only one of the plurality of conductive lines C, may be electrically connected to the connection member 100 to transmit voltage information. As used herein, the description of a conductive line C being electrically connected to a connection member 100 to transmit voltage information may mean that the conductive line C continuously extends from the connection member 100 to the first end portion $E_1$ to transmit voltage information obtained from the connection member 100 to the first end portion $E_1$. In an implementation, the conductive lines C other than the conductive line C electrically connected to the connection member 100 may form physical connections with the connection member 100 to function as dummy lines D that physically reinforce the connection of the connection member 100. As used herein, the description of a dummy line D being physically connected to a connection member 100 and not electrically connected to the connection member 100 may mean that the dummy line D does not (e.g., continuously) extend from the connection member 100 to the first end portion $E_1$, and is disconnected from the first end portion $E_1$, e.g., due to a cut position, e.g., cut positions $T_1$, $T_2$, and $T_3$, and thus voltage information obtained from the connection member 100 may not be transmitted to the first end portion $E_1$ through the dummy line D. Dummy lines D will be described in greater detail below.

Referring to FIG. 6, a plurality of conductive lines $C_1$, $C_2$, $C_3$, and $C_4$ may be connected to one connection member 100 at a connection position $P_4$ to physically reinforce the connection of the connection member 100. In an implementation, only the conductive line $C_4$ of the plurality of conductive lines $C_1$, $C_2$, $C_3$, and $C_4$ may be electrically connected to the connection member 100 to transmit voltage information obtained through the connection member 100 to the first end portion $E_1$, and the other conductive lines $C_1$, $C_2$, and $C_3$ may be dummy lines D, which are electrically disconnected or isolated from the first end portion $E_1$, e.g., due to a cut position $T_3$.

In an implementation, referring to FIG. 5, the flexible wiring 50 may include, e.g., a plurality of conductive lines C extending from the first end portion $E_1$ in the first direction $Z_1$; and an isolation pattern I having an isolated shape that protrudes in the second direction $Z_2$ away from the separation space 50'. The isolation pattern I may physically reinforce the connection of a connection member 100 by forming a physical connection with the connection member 100, and at a connection position P, the isolation pattern I may have a shape protruding in the second direction $Z_2$ away from the separation space 50'. In an implementation, the isolation pattern I may help form a stronger physical connection with the connection member 100, and may not form an electrical connection with the connection member 100. In an implementation, the isolation pattern I may help physically reinforce the connection of the connection member 100 like the dummy lines D described above. In an implementation, the isolation pattern I may include a completely isolated conductive line C therein, which may be connected to the connection member 100, thereby helping to physically reinforce the connection of the connection member 100.

In an implementation, referring to FIG. 6, the conductive lines C may be connected to connection members 100 respectively at connection positions $P_1$, $P_2$, $P_3$, and $P_4$ which are arranged in or spaced apart along the first direction $Z_1$ to transmit voltage information obtained through the connection members 100 to the first end portion $E_1$. In an implementation, each conductive line C may extend in the first direction $Z_1$ from the first end portion $E_1$ and may be connected to a connection member 100 at a connection position P. In an implementation, after the connection point P, the connection line C may not be involved in transmitting voltage information. In an implementation, the cut positions $T_1$, $T_2$, and $T_3$ may be on or in the conductive lines C after connection positions $P_1$, $P_2$, and $P_3$ in the first direction $Z_1$ to disconnect the conductive lines C. In an implementation, each conductive line C in a region from the first end portion $E_1$ to a connection position P (e.g., a portion of the conductive line C in front of a connection position P) may be involved in transmitting information, and after the connection point P, the conductive line C (e.g., a portion of conductive line C behind or past the connection position P) may not be involved in transmitting information, e.g., because the conductive line C behind the connection position P may be removed at a cut position T or may otherwise be disconnected at the cut position T from the conductive line C in front of the connection position P. In an implementation, the conductive line C behind the cut position T may not be electrically connected to the first end portion $E_1$ and thus may not have an electrical function of transmitting signals. The conductive line C behind the cut position T may be a dummy line D that physically reinforces the connection of the connection member 100 (e.g., at the connection position $P_2$, $P_3$, or $P_4$). In an implementation, the dummy line D may be electrically separated from the corresponding conductive line C in front of the cut position T because of the cut position T. In an implementation, even when the dummy line D is connected to adjacent conductive lines C, an electrical short may not occur therebetween. In an implementation, in the case of first and second conductive lines $C_1$ and $C_2$ adjacent to each other (e.g., in the second direction $Z_2$), one portion of the first conductive line $C_1$ (behind a cut position $T_1$) may be electrically separated from the other portion of the first conductive line $C_1$ in front of the cut position $T_1$ because of the cut position $T_1$, and thus the first conductive line $C_1$ behind the cut position $T_1$ may be connected to a same connection member 100 together with the second conductive line $C_2$ (at the connection position $P_2$), e.g., without electrically interfering therewith. As described above, the first conductive line $C_1$ behind the cut position $T_1$ and the second conductive line $C_2$ may be connected together to the connection member 100 (at the connection position $P_2$), thereby making it possible to more securely maintain the connection of the connection member 100, physically reinforce the connection of the connection member 100, and stabilize transmission of voltage information through the conductive line $C_2$. In an implementation, the portion of the first conductive line $C_1$ behind the cut position $T_1$ may be connected (at the connection position $P_2$) to the same connection member 100 together with the second conductive line $C_2$ adjacent to the first conductive line $C_1$, and the first conductive line $C_1$ behind the cut position $T_1$ may help physically reinforce the connection of the connection member 100 and stabilize transmission of voltage information through the second conductive line $C_2$ (adjacent to the first conductive line $C_1$).

In an implementation, the conductive lines C and the connection members 100 may be connected to each other at different connection positions $P_1$, $P_2$, $P_3$, and $P_4$ arranged in the first direction $Z_1$ in which the conductive lines C extends, a conductive line C having a connection position P relatively close or proximate to the first end portion $E_1$ (e.g., along the first direction $Z_1$) may have relatively low resistance, and a conductive line C having a connection position P relatively distant from or distal to the first end portion $E_1$ may have relatively large resistance. This resistance imbalance between different conductive lines C could cause errors when measuring voltages through the conductive lines C. Voltage information transmitted through a conductive line C having a connection position P relatively distant from the first end portion $E_1$ could be subjected to relatively large signal attenuation because of relatively large resistance, and a conductive line C having a connection position P relatively close to the first end portion $E_1$ could be subjected to relatively low signal attenuation because of relatively small resistance. Voltage information transmitted through different conductive lines C could be distorted while experiencing different signal attenuations depending on the connection positions P of the corresponding conductive lines C.

In an implementation, as shown in FIG. 7, in an effort to help reduce or avoid measurement errors caused by distance imbalance from the first end portion $E_1$ to connection positions P, two or more conductive lines C may be electrically connected to each other according to the distances from the first end portion $E_1$ (e.g., along the first direction $Z_1$) to connection positions P to form the two or more conductive lines C as parallel conductive lines Pc through which the same voltage information may be transmitted. In an implementation, a conductive line C having a connection position $P_2$ $P_4$ relatively distant from the first end portion $E_1$ may be (e.g., electrically) connected to a connection member 100 together with an adjacent conductive line C to form parallel conductive lines Pc through which the same voltage information is transmitted. In an implementation, the first and second conductive lines $C_1$ and $C_2$ adjacent to each other may be (e.g., electrically) connected to the same connection member 100 (at the connection position $P_2$) to transmit the same voltage information through the first and second conductive lines $C_1$ and $C_2$. In an implementation, the first and second conductive lines $C_1$ and $C_2$ adjacent to each other may be connected to the same connection member 100 at the connection position $P_2$ to form the first and second conductive lines $C_1$ and $C_2$ as parallel conductive lines Pc through which the same voltage information is transmitted. In an implementation, at least two of the conductive lines C of the flexible wiring 50 may be formed as parallel conductive lines Pc by (e.g., electrically) connecting the at least two conductive lines C to the same connection member 100.

In an implementation, the first and second conductive lines $C_1$, and $C_2$ may be connected to the same connection member 100 as parallel conductive lines Pc through which the same voltage information is transmitted. In an implementation, the first and second conductive lines $C_1$ and $C_2$, which extend from the first end portion $E_1$ in the first direction $Z_1$, may be (e.g., electrically) connected to the same connection member 100 at the connection position $P_2$. In an implementation, the first and second conductive lines $C_1$ and $C_2$ may be connected in parallel to each other from the first end portion $E_1$ to the connection position $P_2$, thereby forming parallel conductive lines Pc through which voltage information obtained at the connection position $P_2$ is transmitted to the first end portion $E_1$. In an implementation, the first and second conductive lines $C_1$ and $C_2$ may have a cut position $T_2$ behind the connection position $P_2$.

In an implementation, as shown in FIG. 8, the first and second conductive lines $C_1$ and $C_2$ may be connected in parallel to each other, not between the connection position $P_2$ and the first end portion $E_1$, but between the connection position $P_2$ and a bridge line 150, which may be between the first end portion $E_1$ and the connection position $P_2$. In an implementation, the first and second conductive lines $C_1$ and $C_2$ may be connected to each other through the bridge line 150 in front of the connection position $P_2$ and may be (e.g., electrically) connected to the same connection member 100 at the connection position $P_2$ such that the first and second conductive lines $C_1$ and $C_2$ may be connected in parallel to each other from the bridge line 150 to the connection position $P_2$. In an implementation, the first conductive line $C_1$ may be connected to the second conductive line $C_2$ through the bridge line 150 and may have a cut position $T_1$ in front of the bridge line 150. In an implementation, the portion of the first conductive line $C_1$ connected to the bridge line may still be electrically isolated from the connection member 100 at connection position $P_1$.

The first conductive line $C_1$ behind the cut position $T_1$ may support the connection member 100 together with the second conductive line $C_2$ and may be a dummy line D or reinforcing line that physically reinforce the connection of the connection member 100. In an implementation, the first conductive line $C_1$ behind the cut position $T_1$ may be (e.g., electrically) connected to the second conductive line $C_2$ through the bridge line 150 to form parallel conductive lines Pc between the bridge line 150 and the connection position $P_2$ through which the same voltage information may be transmitted.

In an implementation, the number of conductive lines C forming parallel conductive lines Pc may vary with or depending upon the distances (e.g., in the first direction $Z_1$) from the first end portion $E_1$ to the connection positions $P_2$, $P_3$, and $P_4$. In an implementation, the number of conductive lines C forming parallel conductive lines Pc may increase or decrease according to the distances from the first end portion $E_1$ to the connection positions $P_2$, $P_3$, and $P_4$. In an implementation, as shown in FIG. 8, as the distance from the first end portion $E_1$ increases, the number of parallel conductive lines Pc connected in parallel to each other between bridge lines 150 and connection positions $P_2$, $P_3$, and $P_4$ may increase to, e.g., two, three, and four.

In an implementation, the first and second conductive lines $C_1$ and $C_2$ together may form parallel conductive lines Pc, and the first conductive line $C_1$ may have the cut positions $T_1$ and $T_2$ before and after the connection position $P_2$ of the second conductive line $C_2$. In an implementation, as shown in FIG. 7, the second conductive line $C_2$ may be connected to the connection member 100 together with the first conductive line $C_1$ in front of the cut position $T_2$ of the first conductive line $C_1$, or as shown in FIG. 8, the second conductive line $C_2$ may be connected to the first conductive line $C_1$ through the bridge line 150 behind the cut position $T_1$ of the first conductive line $C_1$.

In an implementation, as shown in FIG. 7, even when the first conductive line $C_1$ in front of the cut position $T_2$ forms parallel conductive lines Pc together with the second conductive line $C_2$, the first conductive line $C_1$ in front of the cut position $T_2$ may support the same connection member 100 together with the second conductive line $C_2$, and may thus help physically reinforce the connection of the connection member 100 together with the second conductive line $C_2$. In an implementation, the first conductive line $C_1$ in front of the cut position $T_2$ may form parallel conductive lines Pc together with the second conductive line $C_2$ to transmit the same voltage information, the first conductive line $C_1$ may be a dummy line D, which may help support the connection member 100 together with the second conductive line $C_2$.

In an implementation, as shown in FIG. 6, in the case of the first and second conductive lines $C_1$ and $C_2$, the first conductive line $C_1$ behind the cut position $T_1$ and the second conductive line $C_2$ may be connected to each other through the same connection member 100, and it may be understood that the first conductive line $C_1$ behind the cut position $T_1$ may be a dummy line D that helps physically reinforce the connection of the connection member 100 together with the second conductive line $C_2$. In an implementation, as shown in FIG. 7, when the first conductive line $C_1$ in front of the cut position $T_2$ and the second conductive line $C_2$ are connected to each other through the same connection member 100, it may be understood that the first conductive line $C_1$ in front of the cut position $T_2$ forms parallel conductive lines Pc together with the second conductive line $C_2$ for transmission of the same voltage information.

In an implementation, as shown in FIG. 8, the first conductive line $C_1$ behind the cut position $T_1$ may be a dummy line D or support physically reinforcing the connection of the connection member 100 by supporting the connection member 100 together with the second conductive line $C_2$, and the first conductive line $C_1$ behind the cut position $T_1$ may be (e.g., electrically) connected to the second conductive line $C_2$ through the bridge line 150 to form parallel lines Pc together with the second conductive line $C_2$ to transmit the same voltage information. In an implementation, it may be understood that the first conductive line $C_1$ behind the cut position $T_1$ may have both the physical function of a dummy line D and the electrical function of a parallel conductive line Pc.

Throughout the present specification, a cut position T may be on or in a conductive line C to disconnect the conductive line C at the cut position T, and the insulating film IF in which the conductive line C is embedded may also be removed at the cut position T together with the conductive line C. In an implementation, the cut position T may be in the form of a closed hole inside the flexible wiring 50 or in the form of a groove open to the outside of the flexible wiring 50. In an implementation, the insulating film IF in which the conductive line C is embedded may also be removed at the cut position together with the conductive line C to form the cut position T in the form of a closed hole or an open groove.

In an implementation, referring to FIGS. 1 and 2, the flexible wiring 50 (or the conductive lines C of the flexible wiring 50), that transmits information on the states of the battery cells 10, may extend from the first end portion $E_1$ and may be connected to different bus bars B. In an implementation, the flexible wiring 50 (or the conductive lines C of the flexible wiring 50) may be directly connected to the battery cells 10 instead of being connected to the bus bars B connected to the battery cells 10. In an implementation, the flexible wiring 50 (or the conductive lines C of the flexible wiring 50) may be directly connected to the first and second electrodes 11 and 12 of the battery cells 10 to obtain voltage information, instead of being connected to the bus bars B connected to the battery cells 10. In an implementation, the flexible wiring 50, for obtaining information about the states of the battery cells 10, may transmit temperature information rather than voltage information. In an implementation, the flexible wiring 50 (or the conductive lines C of the flexible wiring 50) may be connected to the battery cells 10 or the bus bars B connected to the battery cells 10 to transmit information on the temperatures of the battery cells 10.

Through the present specification, the description of the flexible wiring 50 (or the conductive lines C of the flexible wiring 50) being connected to the battery cells 10 may include the case in which the flexible wiring 50 (or the conductive lines C of the flexible wiring 50) is connected to the bus bars B or the like connected to the battery cells 10, and the flexible wiring 50 (or the conductive lines C of the flexible wiring 50) may transmit information on the states such as voltages or temperatures of the battery cells 10 through the bus bars B. This is possible because the bus bars B are electrically and thermally connected to the battery cells 10 and thus may share voltage and temperature information with the battery cells 10.

In an implementation, referring to FIG. 5, the conductive lines C may be connected to the bus bar B through the connection member 100. In this case, the connection member 100 may connect the bus bar B and the conductive lines C to each other while extending in the second direction $Z_2$. In an implementation, referring to FIG. 4, the conductive lines C may be directly connected to a bus bar B (or a battery cell 10) through a direction-change portion $F_2$ of the conductive lines C, e.g., without a connection member 100 therebetween. In an implementation, at least one of the conductive lines C may be separated or diverge from a remaining portion of the flexible wiring 50 at a cut position T, and the at least one conductive line C separated from the flexible wiring 50 may be directly connected to the bus bar B (or a battery cell 10) at a connection position P. In an implementation, the conductive lines C may be directly connected to the bus bar B (or a battery cell 10) at the connection position P in front of the cut position T.

The direction-change portion $F_2$ may be formed by folding the conductive lines C, and the conductive lines C may approach the bus bar B (or a battery cell 10) as being folded from the first direction $Z_1$ to the second direction $Z_2$ at the direction-change portion $F_2$. Throughout the present specification, the description of the conductive lines C being folded at the direction-change portion $F_2$ may mean that the insulating film IF in which the conductive lines C are embedded may also be folded together with the conductive lines C. Unlike the folded portion $F_1$ that forms a branching position between the first and second conductive lines $C_1$ and $C_2$, the direction-change portion $F_2$ may be formed by folding the conductive lines C only once. In an implementation, the extension direction of the conductive lines C may be changed from the first direction $Z_1$ to the second direction $Z_2$ by folding the conductive lines once. In an implementation, the direction-change portion $F_2$ may be provided together with a cut position T that separates conductive lines C from the other portion of the flexible wiring 50. In an implementation, an end portion of the flexible wiring 50, e.g., an end portion opposite the first end portion $E_1$, may be directly connected to a bus bar B without a cut position T.

In an implementation, referring to FIG. 1, the circuit unit 200 may be connected to the first end portion $E_1$ of the flexible wiring 50 for connection with the battery cells 10, and may obtain information on the states of the battery cells 10 through the conductive lines C of the flexible wiring 50. In an implementation, the circuit unit 200 may obtain information on the voltages or temperatures of the battery cells 10 as information on the states of the battery cells 10, and based on the information on the states of the battery cells 10 which is obtained through the flexible wiring 50, the circuit unit 200 may function as a battery management system (BMS) for controlling the charge and discharge operations of the battery cells 10.

Referring to FIG. 9, circuit elements 250 may be on the flexible wiring 50 in connection with the conductive lines C. In an implementation, mounting holes M for exposing the conductive lines C may be formed in the insulating film IF in which the conductive lines C are embedded, and each of the circuit element 250 may be mounted on both ends of a portion of a conductive line C exposed through a mounting hole M. In an implementation, each of the circuit elements 250 may be mounted on both ends of a broken portion of a conductive line C such that the circuit element 250 may be connected in series to the conductive line C. Examples of the circuit elements 250 connected to the conductive lines C may include surface mount technology (SMT) elements, e.g., safety elements such as SMT fuses may be connected to the conductive lines C as the circuit elements 250.

In an implementation, the flexible wiring 50 for collecting information about the states of the battery cells 10 may be formed using a flat film cable (FFC) which is relatively inexpensive, and the battery pack may be manufactured with low costs.

In an implementation, although the battery pack may use an FFC having a relatively simple structure in which insulating films are adhered to both sides of uniform conductive lines, instead of using a flexible printed circuit board (FPCB) patterned with an optimized design through a relatively expensive patterning process such as etching, the functions of the battery pack such as the function of vents of the battery pack may be guaranteed or unhindered by folding or cutting the conductive lines of the FFC without changing the structure of the battery pack, and errors may be prevented when detecting state information.

One or more embodiments may provide a battery pack which may be manufactured with low costs.

One or more embodiments may provide a battery pack which may be manufactured with low costs without design changes for preventing state information detection errors.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A battery pack, comprising:

battery cells;

a circuit unit connected to the battery cells; and a flexible wiring connecting the battery cells and the circuit unit to each other, wherein:

the flexible wiring includes:

a first end portion to which a plurality of conductive lines are physically bound; and a first group of conductive lines and a second group of conductive lines which extend from the first end portion, branch off from each other, and then extend in parallel to each other, and the first group of conductive lines includes a folded portion at a branching position at which the first group of conductive lines is separated from the second group of conductive lines, wherein:

the first group of conductive lines includes connection positions that are connected to different battery cells along a first direction at different connection positions, at least two conductive lines of the first group of conductive lines are connected together at each of the different connection positions, the at least two conductive lines connected together at each of the different connection positions include a first conductive line, the first conductive line includes a first cut position at which the first conductive line is cut, and the first cut position of the first conductive line is behind one of the different connection positions in the first direction such that the one of the different connection positions is between the first cut position and the first end portion.

2. The battery pack as claimed in claim 1, wherein the first group of conductive lines and the second group of conductive lines:

extend from the first end portion in the first direction, are spaced apart from each other in a second direction crossing the first direction at the branching position, and are connected to first and second electrodes at opposite sides of the battery cells in the second direction.

3. The battery pack as claimed in claim 1, wherein the connection positions are on a rear side of the folded portion, the rear side being opposite the first end portion in the first direction such that the folded portion is between the connection positions and the first end portion.

4. The battery pack as claimed in claim 1, further comprising a connection member, wherein the at least two conductive lines connected together at each of the connection positions are connected together to the connection member.

5. The battery pack as claimed in claim 1, wherein:

the at least two conductive lines connected together at each of the different connection positions further includes a second conductive line different from the first conductive line, and the first conductive line and the second conductive line include parallel conductive lines which together transmit battery-cell state information obtained at each of the different connection positions to the first end portion.

6. The battery pack as claimed in claim 1, wherein conductive lines of the first group of conductive lines are connected to different battery cells at the different connection positions.

7. The battery pack as claimed in claim 1, further comprising connection members at the connection positions, wherein the connection members extend in a second direction crossing the first direction and are connected to the first group of conductive lines.

8. The battery pack as claimed in claim 1, wherein at least one conductive line of the first group of conductive lines is directly connected, through a direction-change portion at one of the connection positions, to one of the battery cells or to a bus bar connected to the one of the battery cells.

9. The battery pack as claimed in claim 8, wherein the first group of conductive lines includes a second cut position at which the at least one conductive line is cut, the second cut position being behind the direction-change portion in the first direction such that the direction-change portion is between the second cut position and the first end portion.

* * * * *